US012640689B2

(12) United States Patent
Gao et al.

(10) Patent No.: US 12,640,689 B2
(45) Date of Patent: May 26, 2026

(54) LINEARIZATION OF A NON-LINEAR ELECTRONIC DEVICE

(71) Applicant: Telefonaktiebolaget LM Ericsson (publ), Stockholm (SE)

(72) Inventors: Hao Gao, Beijing (CN); Sener Dikmese, Sundbyberg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 688 days.

(21) Appl. No.: 18/008,694

(22) PCT Filed: Jun. 8, 2020

(86) PCT No.: PCT/SE2020/050576
§ 371 (c)(1),
(2) Date: Dec. 7, 2022

(87) PCT Pub. No.: WO2021/251852
PCT Pub. Date: Dec. 16, 2021

(65) Prior Publication Data
US 2023/0216451 A1    Jul. 6, 2023

(51) Int. Cl.
H03F 1/32        (2006.01)
H04B 1/04        (2006.01)

(52) U.S. Cl.
CPC ......... H03F 1/3247 (2013.01); H03F 1/3258 (2013.01); H03F 2201/3233 (2013.01)

(58) Field of Classification Search
CPC ................ H03F 1/3247; H03F 1/3258; H03F 2201/3233; H03F 2200/451; H03F 2201/3224; H03F 3/189; H03F 3/24
(Continued)

(56) References Cited

U.S. PATENT DOCUMENTS 10,523,159 B2 * 12/2019 Megretski ............. H03F 1/3258
2005/0253652 A1   11/2005 Song et al.
(Continued)

FOREIGN PATENT DOCUMENTS

EP        3145140 A1      3/2017
KR      101251542 B1      4/2013
WO    2016078732 A1      5/2016

OTHER PUBLICATIONS

Author Unknown, "Computational complexity of mathematical operations," Wikipedia Article, last edited Oct. 13, 2022, 9 pages.
(Continued)

*Primary Examiner* — Hieu P Nguyen
(74) *Attorney, Agent, or Firm* — Withrow & Terranova, PLLC

(57)        ABSTRACT

There is provided mechanisms for enabling linearization of a non-linear electronic device. A method is performed by a linearizer device. The method comprises receiving an input signal destined to be input to the non-linear electronic device. Input-output characteristics of the non-linear electronic device is in the linearizer device represented by a linearization function defined by a LUT based model of base functions. The linearizer device is configured to in a greedy pursuit framework select the base functions according to a signal reconstruction criterion. The method comprises obtaining an output signal by subjecting the input signal to the linearization function. The method comprises providing the output signal, instead of the input signal, as input to the non-linear electronic device, thereby enabling linearization of the non-linear electronic device.

18 Claims, 5 Drawing Sheets

(58) Field of Classification Search
USPC ......................................................... 330/149
See application file for complete search history.

(56) References Cited

U.S. PATENT DOCUMENTS

| | | | |
|---|---|---|---|
| 2012/0034886 A1 | 2/2012 | McCallister et al. | |
| 2012/0119810 A1 | 5/2012 | Bai | |
| 2013/0271212 A1 | 10/2013 | Bai | |
| 2013/0329833 A1 | 12/2013 | Bai | |
| 2014/0254716 A1 | 9/2014 | Zhou et al. | |
| 2017/0104503 A1 | 4/2017 | Pratt et al. | |
| 2019/0348956 A1* | 11/2019 | Megretski | H03F 1/3247 |

OTHER PUBLICATIONS

Becerra, et al., "Comparative Analysis of Greedy Pursuits for the Order Reduction of Wideband Digital Predistorters," IEEE Transactions on Microwave Theory and Techniques, vol. 67, Issue 9, Sep. 2019, pp. 3575-3585.

Kutyniok, "Theory and Applications of Compressed Sensing" Oct. 15, 2018, Cambridge University Press, 25 pages.

Yao, et al., "Compressive sensing-based adaptive sparse predistorter design for power amplifier linearization," International Journal of Circuit Theory and Application, vol. 46, Issue 4, Apr. 2018, John Wiley & Sons, Ltd., pp. 812-826.

International Search Report and Written Opinion for International Patent Application No. PCT/SE2020/050576, mailed Feb. 22, 2021, 13 pages.

Gilabert, et al., "Spectral Weighting Othogonal Matching Pursuit Algorithm for Enhanced Out-of-Band Digital Predistortion Linearization," IEEE Transactions on Circuits and Systems II: Express Briefs, vol. 66, Issue 7, Jul. 2019, pp. 1277-1281.

Pham, et al., "Multi-Dimensional LUT-based Digital Predistorter for Concurrent Dual-Band Envelope Tracking Power Amplifier Linearization," IEEE Topical Conference on RF/Microwave Power Amplifiers for Radio and Wireless Application, Jan. 2018, pp. 47-50.

Extended European Search Report for European Patent Application No. 20939911.2, mailed Feb. 26, 2024, 12 pages.

* cited by examiner

LINEARIZATION OF A NON-LINEAR ELECTRONIC DEVICE

This application is a 35 U.S.C. § 371 national phase filing of International Application No. PCT/SE2020/050576, filed Jun. 8, 2020, the disclosure of which is incorporated herein by reference in its entirety.

TECHNICAL FIELD

Embodiments presented herein relate to a method, a linearizer device, a computer program, and a computer program product for enabling linearization of a non-linear electronic device.

BACKGROUND

Some electronic devices exhibit non-linear input-output characteristics and are therefore referred to as non-linear electronic devices. Non-linear electronic devices can be found in many types of electronic equipment, such as transmitters, receivers, transceivers, signal converters, and the like. Non-limiting examples of non-linear electronic devices are radio frequency (RF) amplifiers, power amplifiers (PAs), low-noise amplifiers (LNAs), digital-to-analog converters (DACs), and analog-to-digital converters (ADCs).

In some scenarios the non-linear behaviour caused by the non-linear input-output characteristics is undesired and efforts are therefore made to make the non-linear input-output characteristics linear, and thus to linearize the non-linear electronic device. One way to linearize the non-linear electronic device is to connect the output of a linearizer device to the input of the non-linear electronic device such that the input to the non-linear electronic device is fed, and processed by, the linearizer device.

The input-output characteristics of the linearizer device could be selected according to a look-up table (LUT) or memory polynomial (MP) based either on a model of the non-linear electronic device or based on measurements.

Even if the non-linear electronic device might obey a fairly simple model, the linearizer device might have to have a more complex implementation of its linearization function and even need addition of extra terms in a general expression as to give the necessary linearization.

Hence, there is still a need for improved linearization of non-linear electronic devices.

SUMMARY

An object of embodiments herein is to provide efficient linearization of non-linear electronic devices.

In more detail, an object is to provide efficient linearization of non-linear electronic devices in terms of using a linearizer device with modest memory requirements.

According to a first aspect there is presented a method for enabling linearization of a non-linear electronic device. The method is performed by a linearizer device. The method comprises receiving an input signal destined to be input to the non-linear electronic device. Input-output characteristics of the non-linear electronic device is in the linearizer device represented by a linearization function defined by a LUT based model of base functions. The linearizer device is configured to in a greedy pursuit framework select the base functions according to a signal reconstruction criterion. The method comprises obtaining an output signal by subjecting the input signal to the linearization function. The method comprises providing the output signal, instead of the input signal, as input to the non-linear electronic device, thereby enabling linearization of the non-linear electronic device.

According to a second aspect there is presented a linearizer device for enabling linearization of a non-linear electronic device. The linearizer device comprises processing circuitry. The processing circuitry is configured to cause the linearizer device to receive an input signal destined to be input to the non-linear electronic device. Input-output characteristics of the non-linear electronic device is in the linearizer device represented by a linearization function defined by a LUT based model of base functions. The linearizer device is configured to in a greedy pursuit framework select the base functions according to a signal reconstruction criterion. The processing circuitry is configured to cause the linearizer device to obtain an output signal by subjecting the input signal to the linearization function. The processing circuitry is configured to cause the linearizer device to provide the output signal, instead of the input signal, as input to the non-linear electronic device, thereby enabling linearization of the non-linear electronic device.

According to a third aspect there is presented a linearizer device for enabling linearization of a non-linear electronic device. The linearizer device comprises a receive module configured to receive an input signal destined to be input to the non-linear electronic device. Input-output characteristics of the non-linear electronic device is in the linearizer device represented by a linearization function defined by a LUT based model of base functions. The linearizer device is configured to in a greedy pursuit framework select the base functions according to a signal reconstruction criterion. The linearizer device comprises an obtain module configured to obtain an output signal by subjecting the input signal to the linearization function. The linearizer device comprises a provide module configured to provide the output signal, instead of the input signal, as input to the non-linear electronic device, thereby enabling linearization of the non-linear electronic device.

According to a fourth aspect there is presented a computer program for enabling linearization of a non-linear electronic device, the computer program comprising computer program code which, when run on a linearizer device, causes the linearizer device to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously these aspects provide efficient linearization of the non-linear electronic device.

Advantageously these aspects enable the greedy pursuit framework to be used for LUT model optimization in a linearizer device.

Advantageously these aspects enable reduction in the total computational complexity compared to the computational complexity of the existing base function (or memory tap) search strategies.

Advantageously, the disclosed methods and linearizer devices reach better performance with less resources, such as a smaller number of base functions (or memory taps), compared to existing methods and linearizer devices.

Advantageously these aspects enable on the fly updates of the base functions during operation of the linearizer device.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
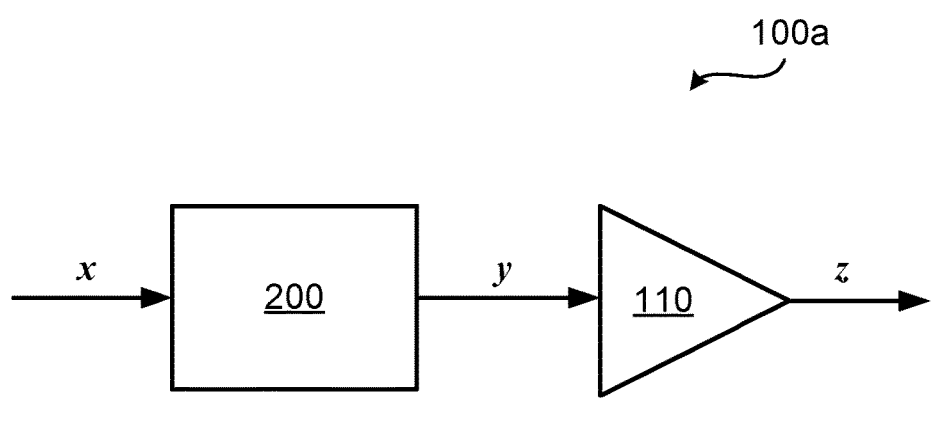
FIGS. 1, 2 and 4 are schematic illustrations of a linearizer device and a non-linear electronic device according to embodiments.

FIG. 1 is a schematic diagram illustrating a system 100*a* comprising a non-linear electronic device 110 and a linearizer device 200 according to an embodiment. The non-linear electronic device 110 is intended to receive an input signal (x) and, after processing, provide an output signal (z). However, a linearizer device 200 is placed in front of the non-linear electronic devices 110 such that the input signal (x) instead is received by the linearizer device 200 which, after processing, provides an output signal (y). This output signal (y) is thus instead of the input signal (x) provided as input to the non-linear electronic devices 110. As will be further disclosed below, the linearizer device 200 is configured to process the signal (x) such that the relation between the signal (z) and the signal (x) appears to be linear. According to a non-limiting example the non-linear electronic device 110 is any of an RF amplifier, PA (such as an RF PA in a transmit radio chain), LNA (such as an LNA in a radio receiver structure), DAC, or ADC. According to a non-limiting example, the linearizer device 200 is a pre-distorter, or an equalizer. In some non-limiting examples, the input signal (x) is received from a signal modulating entity. The signal modulating entity could be a data modulating device e.g. operating at baseband and which is configured to process signals after being channel filtered and/or limited to some amplitude crest factor.

The effects of the memory in the linearizer device 200, corresponding to memory taps (such as data taps and address taps) in modeling the non-linear electronic device 110 are unavoidable where the output of non-linear electronic device 110 does not only depend on the current stage of the input, but also depends on the previous input values of the non-linear electronic device 110. The data taps and address taps correspond to the delays in data and address dimensions, respectively.

Both MP and LUT based models use several base functions to characterize the relationship between the input and the output of the linearizer device 200. The MP and LUT based models can be expressed as in eq. (1) and (2), respectively:

$$y(n) = \sum_{m,l,k} a_{m,l,k} x(n-m) \cdot |x(n-l)|^k \qquad (1)$$

$$y(n) = \sum_{m,l} x(n-m) \cdot f_{m,l}(|x(n-l)|) \qquad (2)$$

In these equations, x(n) and y(n) are the model input and model output, respectively, n is the discrete time index, where n=0, 1, 2, ..., N−1, and m and l are the memory taps, also known as the data delay and the address delay, respectively. Further, k in eq. (1) is the nonlinear order, and $a_{m,l,k}$ is the model coefficient. Further, $f_{m,l}(\xi)$ in eq. (2) denotes the LUT value at index $\xi$ for a LUT $f_{m,l}$ having data delay m and address delay l. It is here noted that these equations to not take into account any noise terms.

Figure 2:
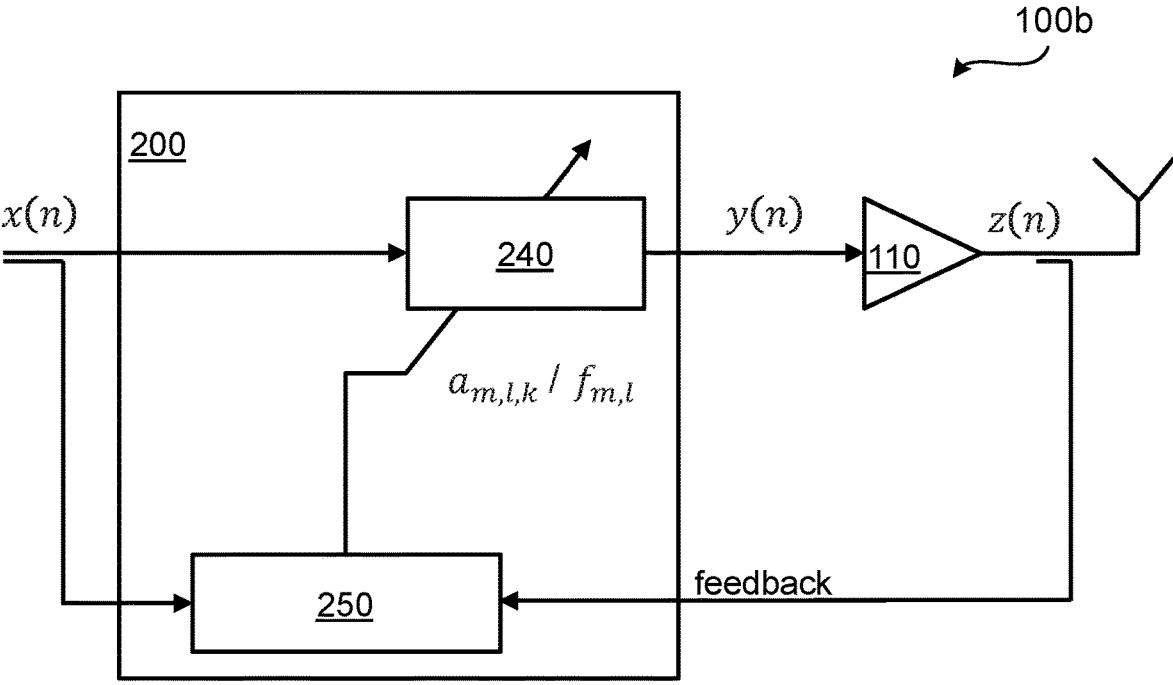

FIG. 2 is a schematic diagram illustrating a system 100*b* comprising a non-linear electronic device 110 and a linearizer device 200, where more details of the linearizer device 200 is shown in comparison to FIG. 1. In FIG. 2 is shown a linearizer device 200 comprising a linearization block 240 configured to process an input signal x(n) so as to obtain a signal y(n) that is provided as input to the non-linear electronic device 110 and an update block 250 configured to, based on the input signal x(n) and feedback from the output of the non-linear electronic device 110, update the coefficients $a_{m,l,k}$ of the MP model and/or the LUT $f_{m,l}$ of the LUT model.

In general terms, the performance of the linearizer device 200 will improve as more base functions are used. This improvement comes at a cost of computational complexity and resource utilization. Therefore, in real products, the model used in the linearizer device 200 generally needs to be pruned, or optimized, by limiting the number of memory taps.

A basic model in a greedy pursuit framework can be formulated as follows:

$$y = Xh + w \qquad (3)$$

In comparison to eq. (1) and eq. (2) above, y is the output signal in vector notation, X is a matrix of base functions, h represents a model coefficient vector (thus defined either by a vector of the coefficients $a_{m,l,k}$ in eq. (1) or a vector of the LUT $f_{m,l}$ in eq. (2)), and w represents an error, in vector notation, of the model.

The greedy pursuit framework involves step-wise element selection and coefficient update. In each step, a decision is commonly made based on some locally optimal optimization criterion. The base functions X and the output signal y are used as input in the greedy pursuit framework, a support set $S^{(i)}$ is returned as output. The support set $S^{(i)}$ includes the indices of the selected columns of X. A residual error r for each iteration step i can be determined as:

$$r^{(i)} = y - \hat{y}^{(i)} \tag{4}$$

In eq. (4), $\hat{y}^{(i)}$ is the estimate output in vector notation of the actual output y with respect to the selected columns of X, and the superscript (i) represents the i-th iteration. New components could be included in the support set based on the particular selection algorithm. Finally, once the stopping criterion is met, the algorithm stops and returns the selected support set $S^{(i)}$. The stopping criterion can be various such as the number of the desired coefficients. The general greedy pursuit framework is summarized in Algorithm 1.

---

Algorithm 1: General greedy pursuit framework

---

Input: y and X
for i = 1; i: = i + 1 until stopping criterion is met do
   1.     Calculate $g^{(i)} = X^H r^{(i)}$
   2.     Select columns of X based on some criteria related to the
           magnitude of the elements of $g^{(i)}$ and include them into $S^{(i)}$
   3.     Update the estimation $\hat{y}^{(i)}$ and $r^{(i)}$
end for
Output: $S^{(i)}$

---

In the general greedy pursuit framework, new columns of X are selected based on some criteria related to the magnitude of the elements of $g^{(i)}$ For instance, in a traditional orthogonal matching pursuit (OMP) method, the normalized correlation is used as follows:

$$g_{\{j\}}^{(i)} = \frac{X_{\{j\}}^H}{\|X_{\{j\}}\|_2} r^{(i)} \tag{5}$$

where the sub-index {j} of the matrix X denotes its jth column.

The greedy pursuit can be used for memory tap optimization. In this respect, eq. (2) can be written in linear form, but each base function $x(n-m) \cdot f_{m,l}(x(n-l))$ does not correspond to one specific scalar. There will be one LUT $f_{m,l}$ with several LUT values corresponding to the specific data delay m and the specific address delay l. For instance, in the case that the signal magnitude space is divided into 64 bins, there will be 64 bin values in the LUT $f_{m,l}$. Hence, it is not possible to use a magnitude-based criterion in eq. (5).

The embodiments disclosed herein therefore relate to mechanisms for enabling linearization of a non-linear electronic device 110. In order to obtain such mechanisms there is provided a linearizer device 200, a method performed by the linearizer device 200, a computer program product comprising code, for example in the form of a computer program, that when run on a linearizer device 200, causes the linearizer device 200 to perform the method.

Figure 3:
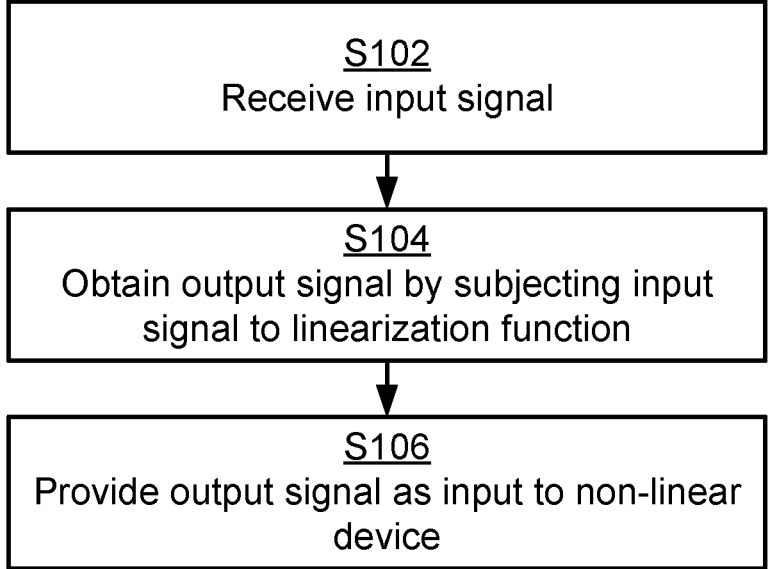
FIGS. 3 and 5 are flowcharts of methods according to embodiments.

FIG. 3 is a flowchart illustrating embodiments of methods for enabling linearization of a non-linear electronic device 110. The methods are performed by the linearizer device 200. The methods are advantageously provided as computer programs 820.

S102: The linearizer device 200 receives an input signal (x). The input signal (x) is destined to be input to the non-linear electronic device 110.

Input-output characteristics of the non-linear electronic device 110 is in the linearizer device 200 represented by a linearization function. The linearization is defined by a LUT based model of base functions. The linearizer device 200 is configured to in a greedy pursuit framework select the base functions according to a signal reconstruction criterion.

S104: The linearizer device 200 obtains an output signal (y) by subjecting the input signal (x) to the linearization function.

S106: The linearizer device 200 provides the output signal (y), instead of the input signal (x), as input to the non-linear electronic device 110, thereby enabling linearization of the non-linear electronic device 110.

Embodiments relating to further details of enabling linearization of a non-linear electronic device 110 as performed by the linearizer device 200 will now be disclosed.

In some embodiments each base function represents a memory tap pair. In some embodiments each memory tap pair consists of one data delay value m and one address delay value l. That is, in some examples each memory tap pair can be written as a tuple (m,l).

Figure 4:
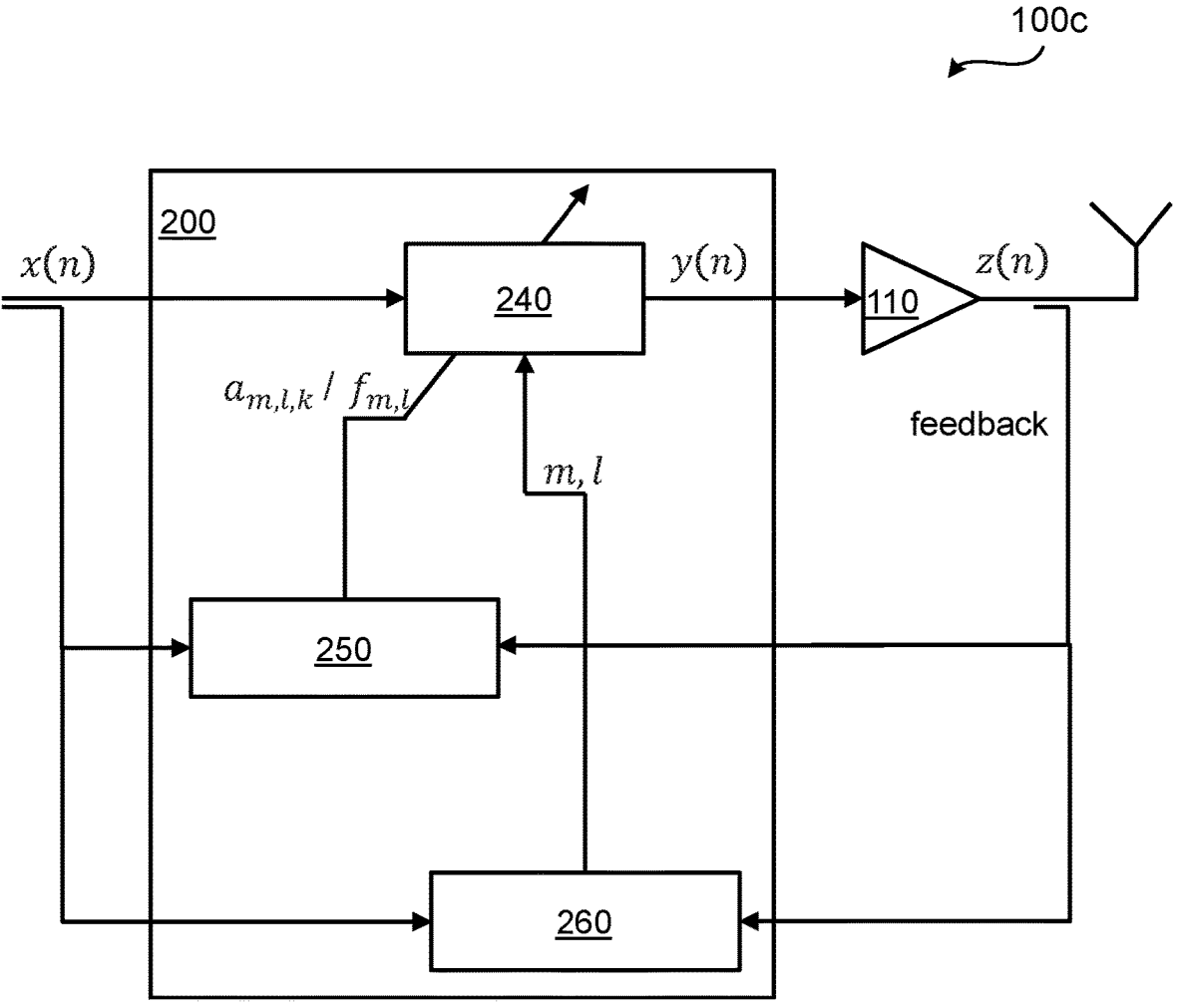

FIG. 4 is a schematic diagram illustrating a system 100c comprising a non-linear electronic device 110 and a linearizer device 200, where more details of the linearizer device 200 is shown in comparison to FIG. 2. In FIG. 4 is shown a linearizer device 200 comprising a linearization block 240 configured to process an input signal x(n) so as to obtain a signal y(n) that is provided as input to the non-linear electronic device 110, an update block 250 configured to, based on the input signal x(n) and feedback from the output of the non-linear electronic device 110, update the coefficients $a_{m,l,k}$ of the MP model and/or the LUT $f_{m,l}$ of the LUT model, and an optimization block 260 configured to, based on the input signal x(n) and feedback from the output of the non-linear electronic device 110, optimize the data delay value m and the address delay value l.

In the modeling of the nonlinear response of a non-linear electronic device 110 in discrete time domain, the LUT based model can be generally expressed as:

$$y(n) = \sum_{m,l} x(n - m) f_{m,l}(|x(n - l)|) + w(n) \tag{6}$$

As above, y(n) is the model output with x(n) and w(n) denoting the model input and the error of the model, respectively. Furthermore, n is the discrete time index, n=0, 1, 2, . . . , N−1, and $f_{m,l}$ denotes the LUT with the data delay m and the address delay l.

Optimization of the LUT based model can be performed with respect to parameter optimization of the data delay m and the address delay l, thus defining a memory tap optimization problem. Such an optimization problem can be solved by trial and error, by starting with a large number of LUTs and searching all the combinations of the parameters in order to find the LUTs yielding good performance. Application of the greedy pursuit framework to the memory tap optimization problem improves the optimization efficiency.

In some embodiments, the signal reconstruction criterion pertains to selecting base functions that maximize a bin value based function. In particular, in some aspects, the importance of LUT $f_{m,l}$ is measured based on using a bin value based function, such as:

$$m, l = \operatorname{argmax}_{m,l}[F(f_{m,l}(k))]$$

There could be different examples of the functions F(•). In some examples F(•) represents a weighted bin value (WBV) function and thus the bin value based function can be expressed as follows:

$$m, l = \operatorname{argmax}_{m,l}\left[\sum_{k=1}^{K} p(k) \cdot |f_{m,l}(k)|^q\right]$$

In this equation, p(k) denotes the probability of the data x being in the kth bin of LUT $f_{m,l}$. In some examples, F(•) represents an alternative criterion as follows:

$$m, l = \operatorname{argmax}_{m,l}[\max_k(f_{m,l}(k))]$$

In some embodiments, the signal reconstruction criterion pertains to selecting base functions that minimize a mean squared error (MSE). In particular, in some aspects, the importance of LUT $f_{m,l}$ is measured based on minimizing of the MSE criterion. In particular, the memory tap optimization problem can be iteratively solved according to the following expression:

$$m, l = \operatorname{argmin}_{m,l}\left\| r^{(i)} - x(n-m) \circ f_{m,l}(|x(n-l)|) \right\|_2 \quad (8)$$

where $f_{m,l}(|x(n-l)|)=[f_{m,l}(|x(1-l)|),f_{m,l}(|x(1-l)|), \ldots f_{m,l}(|x(N-1-l)|)]^T$, ○ is Hadamard product, and $\|•\|_2$ is the $\ell$ vector norm, and i is the iteration step index.

Define by $\operatorname{argmin}_{(m,l)}^S(•)$ an operation that returns S parameter pairs (m,l) corresponding to the smallest S values of the function (•). Hence, the optimization problem defined as:

$$\operatorname{argmin}_{(m,l)}^S\left(\left\| r^{(i)} - x(n-m) \circ f_{m,l}(|x(n-l)|) \right\|_2\right) \quad (9)$$

returns S pairs (m,l) corresponding to the smallest S function values of $\|r^{(i)}-x(n-m) \circ f_{m,l}(|x(n-l)|)\|_2$.

With regards to the function (•) with S pairs (m,l) as one input, these (m,l) pairs can form a set S={(m,l)} whose cardinality is S.

Define by $\operatorname{argmin}_S^1(•)$ an operation that returns one parameter set S corresponding to the smallest value of the function (•). Hence, the optimization problem defined as:

$$\operatorname{argmin}_S^1\left(\left\| y - \sum_{(m,l)\in S} x(n-m) \circ f_{m,l}(|x(n-l)|) \right\|_2\right) \quad (10)$$

returns a set S corresponding to the smallest function value of $\|y-\Sigma_{(m,l)\in S}x(n-m) \circ f_{m,l}(|x(n-l)|)\|_2$ Denote by Q the set of all candidate LUTs (m,l), where the cardinality of Q is Q.

In some aspects, the base functions are iteratively determined. In particular, in some embodiments, the base functions form a set of base functions $S^{(i)}$, and wherein according to the greedy pursuit framework the set of base functions $S^{(i)}$ is iteratively determined.

In some aspects, the base functions are determined from a candidate set of base functions. In particular, in some embodiments, the set of base functions $S^{(i)}$ is determined from a candidate set $\tilde{S}^{(i)}$ of base functions.

There could be different ways to determine the candidate set of base functions. In some embodiments, per each iteration i, the candidate set $\tilde{S}^{(i)}$ of base functions is formed by adding an intermediate set T to the set of base functions $S^{(i-1)}$ selected at iteration i−1.

There could be different ways to determine the intermediate set of base functions. In some embodiments, the intermediate set T comprises T base functions corresponding to smallest differences between a residual error $r^{(i-1)}$ and an estimate of the residual error for iteration i. For example, the candidate set $\tilde{S}^{(i)}$ for iteration i might be formed as:

$$\tilde{S}^{(i)} = S^{(i-1)} \cup \left\{\operatorname{argmin}_{(m,l)}^T\left(\left\| r^{(i-1)} - x(n-m) \circ f_{m,l}(|x(n-l)|) \right\|_2\right)\right\}.$$

Per each iteration i, the set of base functions $S^{(i)}$ corresponding to smallest difference between a desired output signal y and an estimate of the desired output signal might be selected from the candidate set $\tilde{S}^{(i)}$. In some embodiments, one estimate of the desired output signal is formed for each of all possible combinations of the base functions in the candidate set $\tilde{S}^{(i)}$ per each iteration i. For example, the set of base functions $S^{(i)}$, for all S-element subsets $L \subseteq \tilde{S}^{(i)}$, for iteration i might be selected as:

$$S^{(i)} = \operatorname{argmin}_{L \subseteq \tilde{S}^{(i)}}^1\left(\left\| y - \sum_{(m,l)\in L} x(n-m) \circ f_{m,l}(|x(n-l)|) \right\|_2\right).$$

Per each iteration i, the residual error $r^{(i)}$ might be updated as the difference between the desired output signal y and the estimate $\hat{y}^{(i)}$ of the desired output signal corresponding to the selected set of base functions $S^{(i)}$ at iteration i. For example, the residual error $r^{(i)}$ for iteration i might be updated as:

$$r^{(i)} = y - \hat{y}^{(i)}.$$

Further, the estimate $\hat{y}^{(i)}$ of the desired output signal for iteration i might be determined as:

$$\hat{y}^{(i)} = \sum_{(m,l)\in S^{(i)}} x(n-m) \circ f_{m,l}(|x(n-l)|).$$

In summary, one way for the linearizer device 200 to in a greedy pursuit framework select the base functions according to a signal reconstruction criterion based on at least some of the above embodiments, aspects, and examples can be defined as in Algorithm 2.

---

Algorithm 2: LUT subspace pursuit with MSE criterion

---

Input: y, x, LUT set Q = {(m, l)}, and expected LUT number S
Initialization: set expected LUT set $S^{(0)}$ = Ø, set residual $r^{(0)}$ = y
for i = 1; i: = i + 1 until stopping criterion is met do
  1. Calculate $\tilde{S}^{(i)}$ as
    $\tilde{S}^{(i)} = S^{(i-1)} \cup \{argmin_{(m,l)}{}^T (\|r^{(i-1)} - x(n-m) \circ f_{m,l} (|x(n-l)|)\|_2)\}$
  2. For all the S-element subsets $L \subseteq \tilde{S}^{(i)}$, calculate $S^{(i)}$ as $$S^{(i)} = argmin^1_{L \subseteq \tilde{S}^{(i)}} \left( \left\| y - \sum_{(m,l) \in L} x(n-m) \circ f_{m,l}(|x(n-l)|) \right\|_2 \right)$$

3. Update the estimation $$\hat{y}^{(i)} = \sum_{(m,l) \in S^{(i)}} x(n-m) \circ f_{m,l}(|x(n-l)|)$$

and
$$r^{(i)} = y - \hat{y}^{(i)}$$
end for
Output: $S^{(i)}$

---

Figure 5:
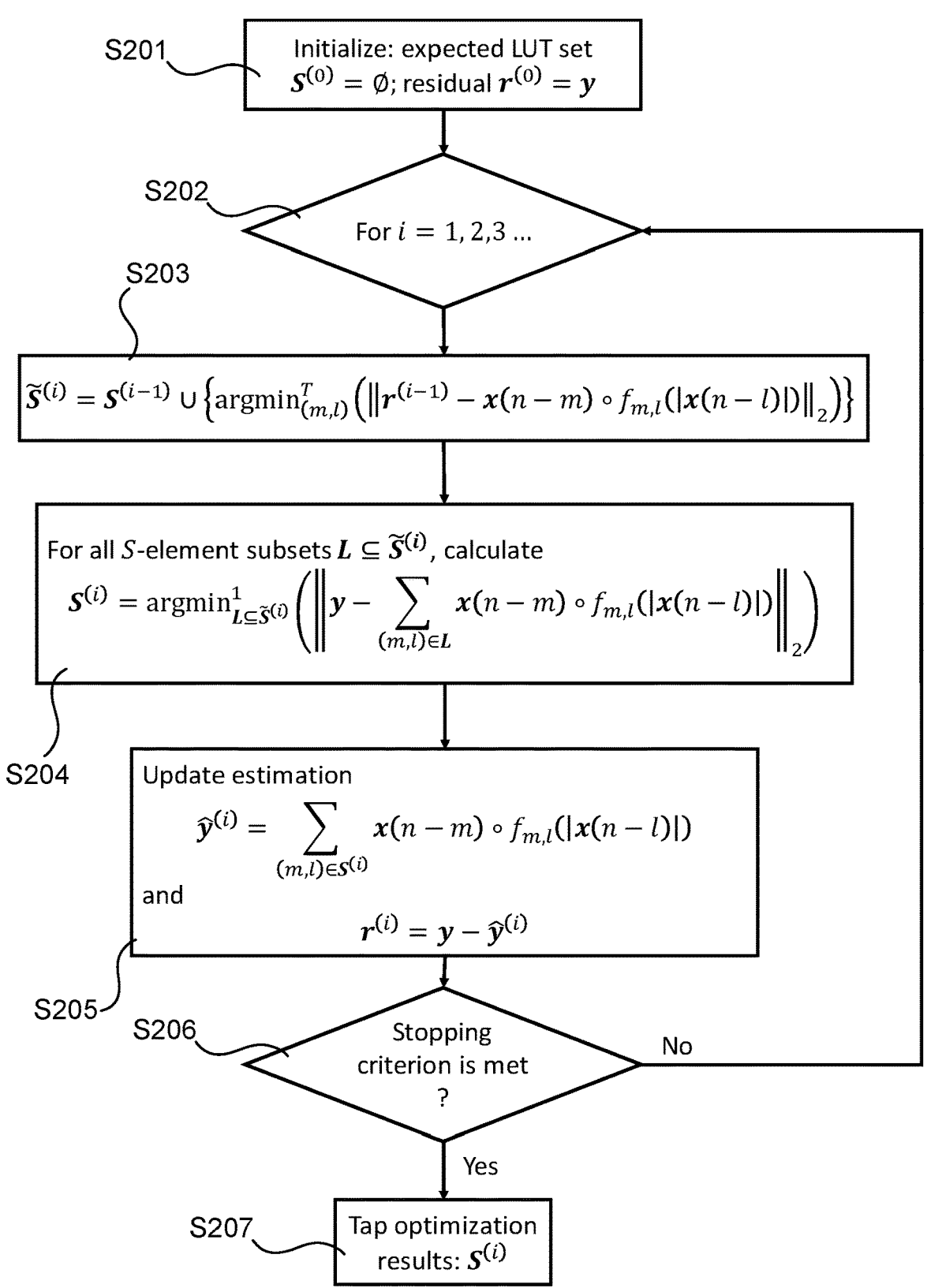

Further aspects of Algorithm 2 will be disclosed next with reference to the flowchart of FIG. 5. In step S201, initialization is performed. In some non-limiting examples, T=S as a default. In step S202, an iteration step counter is incremented by 1 for each new iteration step.

In step S203, at iteration i a set $\tilde{S}^{(i)}$ is formed as a combination of set $S^{(i-1)}$, where $S^{(i-1)}$ corresponds to the S number of elements selected at iteration i−1, with a new set T comprising the T elements that yields the smallest function values of the function (•), where each element in T is a pair of one m value and one l value. The function (•) defines an optimization problem that returns the set T with T elements. In particular, first the difference between the residual error $r^{(i-1)}$) and its estimate based on each of all the candidate base functions is calculated. Then T base functions corresponding to the smallest differences are selected.

In step S204, from $\tilde{S}(•)$, a set $S^{(i)}$ is determined that yields the smallest value of the function (•). The function of (•) defines an optimization problem that returns a set of $S^{(i)}$ with S elements. In particular, first the difference between the desired output y and its estimate based on each of all the possible combinations of S number of base functions from $\tilde{S}^{(i)}$ base function set is calculated. Then the base function set $S^{(i)}$ corresponding to the smallest difference is selected.

In step S205, the estimate ŷ(i) of the desired output and the residual error $r^{(i)}$ are updated based on the selected values of m and l in the set $S^{(i)}$ values for iteration i.

The end result is a set $S^{(i)}$ that, in terms of the resulting values of m and l, represent data and address delays of the selected base functions.

Steps S202-S205 are repeated until some stopping criterion, which can be selected based on predetermined condition in different scenarios, is reached, as checked in step S206. The stopping criterion might be related to the performance requirement or the status of $S^{(i)}$.

Algorithm 2 as well as the steps of the method in FIG. 5 can be adapted to use another signal reconstruction criterion than selecting base functions that minimize the mean squared error. For example, Algorithm 2 as well as the steps of the method in FIG. 5 can be adapted to select base functions that maximize a bin value based function, such as any of the above disclosed bin value based functions.

Simulation results will now be disclosed with reference to Table 1, Table 2, and Table 3. In these tables, [m, l] correspond to the data delay value and the address delay value, respectively.

In the tables, the WBV LUT subspace pursuit is defined by the WBV function of eq. (7), the MSE LUT subspace pursuit is defined by Algorithm 2, and the generalized MP (GMP) subspace pursuit is defined by first using greedy pursuit on the GMP model and then transfer the resulting memory tap results to the LUT model.

It can be seen that the MSE LUT subspace pursuit outperforms the other two algorithms significantly when the ideal taps are found by the MSE LUT subspace pursuit in Case 1 and 2 of Table 1 and Table 2, respectively. Although the MSE LUT subspace pursuit cannot find the optimal taps in Case 3 of Table 3, its result is not far away from the ideal tap values.

Due to the correlation of the base functions characterized by the use of LUTs, the WBV LUT subspace pursuit and the GMP subspace pursuit have difficulties to find optimal tap values far away from the tap [0,0].

TABLE 1

| Case 1 | Memory tap | NMSE |
|---|---|---|
| Ideal taps | [0 0; 0 2; 8 6] | |
| WBV LUT subspace pursuit | [0 0; 0 1; 0 2] | −29.7 dB |
| MSE LUT subspace pursuit | [0 0; 0 2; 8 6] | −72.8 dB |
| GMP subspace pursuit | [0 0; 0 1; 1 1] | −30.6 dB |

TABLE 2

| Case 2 | Memory tap | NMSE |
|---|---|---|
| Ideal taps | [0 0; 0 1; 3 8; 16 16] | |
| WBV LUT subspace pursuit | [0 0; 0 1; 1 0; 0 2] | −23.8 dB |
| MSE LUT subspace pursuit | [0 0; 0 1; 3 8; 16 16] | −62.9 dB |
| GMP subspace pursuit | [0 0; 0 1; 1 1; 1 0] | −23.7 dB |

TABLE 3

| Case 3 | Memory tap | NMSE |
|---|---|---|
| Ideal taps | [0 0; 2 3; −4 −6; 15 16] | |
| WBV LUT subspace pursuit | [0 0; 0 1; 1 0; 0 2] | −23.6 dB |
| MSE LUT subspace pursuit | [0 0; 2 2; −4 −6; 15 16] | −39.3 dB |
| GMP subspace pursuit | [0 0; 4 4; −1 0; 15 15] | −32.9 dB |

Figure 6:
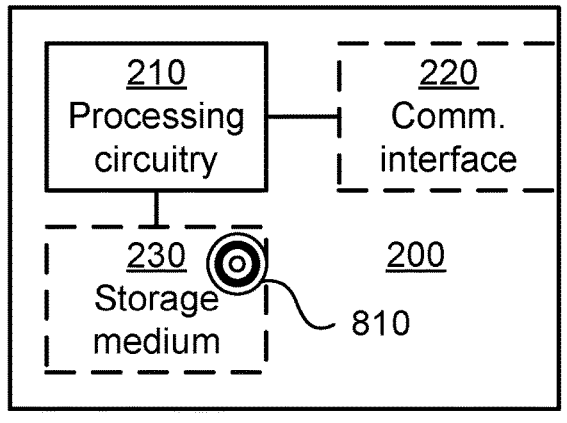
FIG. 6 is a schematic diagram showing functional units of a linearizer device according to an embodiment.

FIG. 6 schematically illustrates, in terms of a number of functional units, the components of a linearizer device 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 810 (as in FIG. 8), e.g. in the form of a storage medium 230. The processing circuitry 210 may further be provided as at least one application specific integrated circuit (ASIC), or field programmable gate array (FPGA).

Particularly, the processing circuitry 210 is configured to cause the linearizer device 200 to perform a set of operations, or steps, as disclosed above. For example, the storage medium 230 may store the set of operations, and the processing circuitry 210 may be configured to retrieve the set of operations from the storage medium 230 to cause the linearizer device 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The linearizer device 200 may further comprise a communications interface 220 at least configured for receiving signals as input and providing processed signals as output. As such the communications interface 220 may comprise one or more transmitters and receivers, comprising analogue and digital components. The processing circuitry 210 controls the general operation of the linearizer device 200 e.g. by sending data and control signals to the communications interface 220 and the storage medium 230, by receiving data and reports from the communications interface 220, and by retrieving data and instructions from the storage medium 230. Other components, as well as the related functionality, of the linearizer device 200 are omitted in order not to obscure the concepts presented herein.

Figure 7:
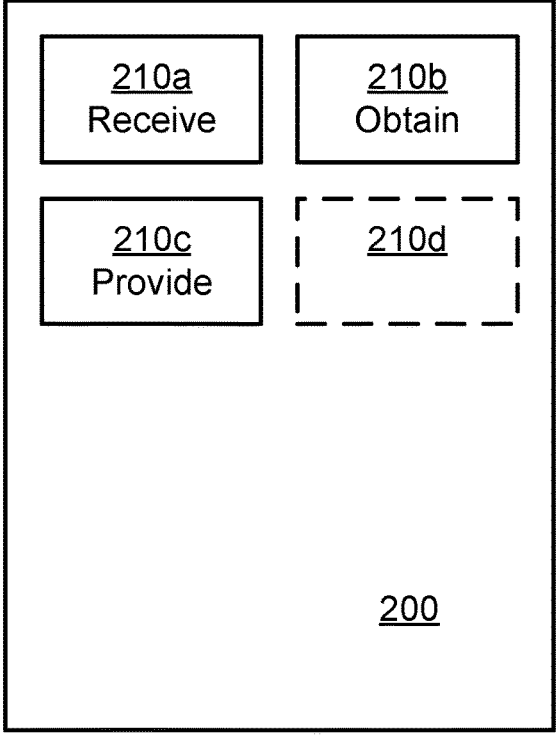
FIG. 7 is a schematic diagram showing functional modules of a linearizer device according to an embodiment.

FIG. 7 schematically illustrates, in terms of a number of functional modules, the components of a linearizer device 200 according to an embodiment. The linearizer device 200 of FIG. 9 comprises a number of functional modules; a receive module 210a configured to perform step S102, an obtain module 210b configured to perform step S104, and a provide module 210c configured to perform step S106. The linearizer device 200 of FIG. 9 may further comprise a number of optional functional modules, as represented by functional module 210d. In general terms, each functional module 210a-210d may in one embodiment be implemented only in hardware and in another embodiment with the help of software, i.e., the latter embodiment having computer program instructions stored on the storage medium 230 which when run on the processing circuitry makes the linearizer device 200 perform the corresponding steps mentioned above in conjunction with FIG. 7. It should also be mentioned that even though the modules correspond to parts of a computer program, they do not need to be separate modules therein, but the way in which they are implemented in software is dependent on the programming language used. Preferably, one or more or all functional modules 210a-210d may be implemented by the processing circuitry 210, possibly in cooperation with the communications interface 220 and/or the storage medium 230. The processing circuitry 210 may thus be configured to from the storage medium 230 fetch instructions as provided by a functional module 210a-210d and to execute these instructions, thereby performing any steps as disclosed herein.

The linearizer device 200 may be provided as a standalone device or as a part of at least one further device. For example, the functionality of the linearizer device 200 may collocated with the functionality of the non-linear electronic device 110. A first portion of the instructions performed by the linearizer device 200 may be executed in a first device, and a second portion of the of the instructions performed by the linearizer device 200 may be executed in a second device; the herein disclosed embodiments are not limited to any particular number of devices on which the instructions performed by the linearizer device 200 may be executed. Examples of linearizer devices 200 have been provided above.

Figure 8:
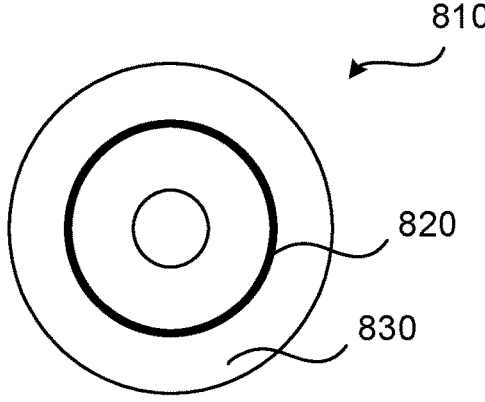
FIG. 8 shows one example of a computer program product comprising computer readable storage medium according to an embodiment.

FIG. 8 shows one example of a computer program product 810 comprising computer readable storage medium 830. On this computer readable storage medium 830, a computer program 820 can be stored, which computer program 820 can cause the processing circuitry 210 and thereto operatively coupled entities and devices, such as the communications interface 220 and the storage medium 230, to execute methods according to embodiments described herein. The computer program 820 and/or computer program product 810 may thus provide means for performing any steps as herein disclosed.

In the example of FIG. 8, the computer program product 810 is illustrated as an optical disc, such as a CD (compact disc) or a DVD (digital versatile disc) or a Blu-Ray disc. The computer program product 810 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 820 is here schematically shown as a track on the depicted optical disk, the computer program 820 can be stored in any way which is suitable for the computer program product 810.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for enabling linearization of a non-linear electronic device, the method being performed by a linearizer device, the method comprising:
   receiving an input signal (x) destined to be input to the non-linear electronic device;
   wherein input-output characteristics of the non-linear electronic device is in the linearizer device represented by a linearization function defined by a LUT based model of base functions, and wherein the linearizer device is configured to in a greedy pursuit framework select the base functions according to a signal reconstruction criterion,
   obtaining an output signal (y) by subjecting the input signal (x) to the linearization function; and
   providing the output signal (y), instead of the input signal (x), as input to the non-linear electronic device, thereby enabling linearization of the non-linear electronic device.

2. The method according to claim 1, wherein each base function represents a memory tap pair.

3. The method according to claim 2, wherein each memory tap pair consists of one data delay value m and one address delay value l.

4. The method according to claim 1, wherein the signal reconstruction criterion pertains to selecting base functions that minimize a mean squared error or maximize a bin value based function.

5. The method according to claim 1, wherein the base functions form a set of base functions $S^{(i)}$, and wherein according to the greedy pursuit framework the set of base functions $S^{(i)}$ is iteratively determined.

6. The method according to claim 5, wherein the set of base functions $S^{(i)}$ is determined from a candidate set $\tilde{S}^{(i)}$ of base functions.

7. The method according to claim 6, wherein per each iteration i, the candidate set $\tilde{S}^{(i)}$ of base functions is formed by adding an intermediate set T to the set of base functions $S^{(i-1)}$ selected at iteration i−1.

8. The method according to claim 7, wherein the intermediate set T comprises T base functions corresponding to smallest differences between a residual error $r^{(i-1)}$ and an estimate of the residual error for iteration i.

9. The method according to claim 8, wherein the candidate set $\tilde{S}^{(i)}$ for iteration i is formed as:

$$\tilde{S}^{(i)} = S^{(i-1)} \cup \left\{ \mathrm{argmin}_{(m,l)}^{T} \left( \left\| r^{(i-1)} - x(n-m) \circ f_{m,l}(|x(n-l)|) \right\|_2 \right) \right\},$$

where $\circ$ denotes Hadamard product, $|\cdot|_2$ denotes $\ell_2$ vector norm, $\cup$ denotes set unit operator, and $f_{m,l}$ denotes the LUT with data delay m and address delay l.

10. The method according to claim 6, wherein per each iteration i, the set of base functions $S^{(i)}$ corresponding to smallest difference between a desired output signal y and an estimate of the desired output signal is selected from the candidate set $\tilde{S}^{(i)}$.

11. The method according to claim 10, wherein one estimate of the desired output signal is formed for each of all possible combinations of the base functions in the candidate set $\tilde{S}^{(i)}$ per each iteration i.

12. The method according to claim 11, wherein the set of base functions $S^{(i)}$, for all S-element subsets $L \subseteq \tilde{S}^{(i)}$, for iteration i is selected as:

$$S^{(i)} = \mathrm{argmin}_{L \subseteq \tilde{S}^{(i)}}^{1} \left( \left\| y - \sum_{(m,l) \in L} x(n-m) \circ f_{m,l}(|x(n-l)|) \right\|_2 \right),$$

where $\circ$ denotes Hadamard product, $|\cdot|_2$ denotes $\ell_2$ vector norm, and $f_{m,l}$ denotes the LUT with data delay m and address delay l.

13. The method according to claim 10, wherein per each iteration i, the residual error $r^{(i)}$ is updated as the difference between the desired output signal y and the estimate $\hat{y}^{(i)}$ of the desired output signal corresponding to the selected set of base functions $S^{(i)}$ at iteration i.

14. The method according to claim 8, wherein the residual error $r^{(i)}$ for iteration i is updated as:

$$r^{(i)} = y - \hat{y}^{(i)}.$$

15. The method according to claim 13, wherein the estimate $\hat{y}^{(i)}$ of the desired output signal for iteration i is determined as:

$$\hat{y}^{(i)} = \sum_{(m,l) \in S^{(i)}} x(n-m) \circ f_{m,l}(|x(n-l)|).$$

16. A linearizer device for enabling linearization of a non-linear electronic device, the linearizer device comprising processing circuitry, the processing circuitry being configured to cause the linearizer device to:

receive an input signal (x) destined to be input to the non-linear electronic device;
    wherein input-output characteristics of the non-linear electronic device is in the linearizer device represented by a linearization function defined by a LUT based model of base functions, and wherein the linearizer device is configured to in a greedy pursuit framework select the base functions according to a signal reconstruction criterion,
obtain an output signal (y) by subjecting the input signal (x) to the linearization function; and
provide the output signal (y), instead of the input signal (x), as input to the non-linear electronic device, thereby enabling linearization of the non-linear electronic device.

17. A linearizer device for enabling linearization of a non-linear electronic device, the linearizer device comprising:
    a receive module configured to receive an input signal (x) destined to be input to the non-linear electronic device;
        wherein input-output characteristics of the non-linear electronic device is in the linearizer device represented by a linearization function defined by a LUT based model of base functions, and wherein the linearizer device is configured to in a greedy pursuit framework select the base functions according to a signal reconstruction criterion,
    an obtain module configured to obtain an output signal (y) by subjecting the input signal (x) to the linearization function; and
    a provide module configured to provide the output signal (y), instead of the input signal (x), as input to the non-linear electronic device, thereby enabling linearization of the non-linear electronic device.

18. A computer program for enabling linearization of a non-linear electronic device, the computer program comprising computer code which, when run on processing circuitry of a linearizer device, causes the linearizer device to:
receive an input signal (x) destined to be input to the non-linear electronic device;
    wherein input-output characteristics of the non-linear electronic device is in the linearizer device represented by a linearization function defined by a LUT based model of base functions, and wherein the linearizer device is configured to in a greedy pursuit framework select the base functions according to a signal reconstruction criterion,
obtain an output signal (y) by subjecting the input signal (x) to the linearization function; and
provide the output signal (y), instead of the input signal (x), as input to the non-linear electronic device, thereby enabling linearization of the non-linear electronic device.

\* \* \* \* \*